(12) United States Patent
Myllymaki

(10) Patent No.: US 6,510,328 B1
(45) Date of Patent: Jan. 21, 2003

(54) RADIO TELEPHONE WITH A COMBINED BATTERY AND SUPPORT STRUCTURE

(75) Inventor: Kimmo Myllymaki, Convent Station, NJ (US)

(73) Assignee: Nokia Mobile Phones, Salo (FI)

( * ) Notice: Subject to any disclaimer, the term of this patent is extended or adjusted under 35 U.S.C. 154(b) by 0 days.

(21) Appl. No.: 07/985,841

(22) Filed: Dec. 3, 1992

(30) Foreign Application Priority Data

Dec. 27, 1991 (FI) .................................................. 916143

(51) Int. Cl.[7] .................................................. H04Q 7/32
(52) U.S. Cl. ........................ 455/575; 455/90; 455/351
(58) Field of Search .............................. 455/89, 90, 95, 455/128, 347, 348, 349, 351, 300, 301, 575; 361/422, 424, 816, 818

(56) References Cited

U.S. PATENT DOCUMENTS

| 3,668,528 | A | * | 6/1972 | Hutchinson et al. | 455/351 |
| 4,648,125 | A | * | 3/1987 | Brown | 455/90 |
| 4,847,818 | A | * | 7/1989 | Olsen | 455/90 X |
| 5,265,265 | A | * | 11/1993 | Hama et al. | 455/300 |

* cited by examiner

*Primary Examiner*—William Trost
*Assistant Examiner*—Philip J. Sobutka
(74) *Attorney, Agent, or Firm*—Perman & Green, LLP

(57) ABSTRACT

A radio telephone in which the re-chargeable battery (1) is an integral structural component. The battery provides Radio Frequency (RF) screening for at least some of the electronic components within the telephone as well as providing additional strength without adding additional weight.

9 Claims, 1 Drawing Sheet

RADIO TELEPHONE WITH A COMBINED BATTERY AND SUPPORT STRUCTURE

BACKGROUND OF THE INVENTION

The present invention relates to a radio telephone comprising a rechargeable battery.

A battery used as the power source of a radio telephone conventionally takes up as much as one half of the weight and volume of the radio telephone. Present day metal hybrid batteries have power densities twice those of traditional NiCd batteries. Therefore, their space requirement is usually less, and thus part, or even all, of the freed volume can be taken advantage of in a radio telephone design in accordance with the invention which utilizes a metal hybrid battery.

SUMMARY OF THE INVENTION

According to the present invention there is provided a radio telephone comprising a housing, a rechargeable battery and a substrate comprising electronic components, characterized in that the battery-forms part of a frame structure to which the substrate and the housing are secured.

A radio telephone in accordance with the present invention enables the battery to be utilized as an integral part of the structure of the radio telephone providing additional strength to the radio telephone without additional weight.

Preferably, the battery may be used to provide Radio Frequency (RF) shielding for at least some of the electronic components within the radio telephone.

The battery used as part of a supporting structure may be flat in shape and somewhat smaller in size than the radio telephone. The battery constitutes a frame around which the required printed circuit boards can be secured firmly on both sides.

The design provides highly efficient shielding against interference, and the mechanical structure can be reinforced with additional structures, when necessary. In state of the art battery design, the battery may be used as a structural element partly because it has a long life expectancy and partly because service requirements may be kept to a minimum. The functioning of the radio telephone in accordance with the present invention as an automobile accessory is not affected by the battery functioning as a structional support. The battery will charge in the same manner as conventional radio telephones.

BRIEF DESCRIPTION OF THE DRAWINGS

Embodiments of the invention are described below, by way of an example, with reference to the accompanying drawing, in which:

FIG. 1 depicts a section taken through I–I in FIG. 2;

FIG. 2 depicts a section taken through II–II in FIG. 1; and

FIG. 3 depicts a section taken through III–III in FIG. 2.

DETAILED DESCRIPTION OF THE INVENTION

Figure 1:
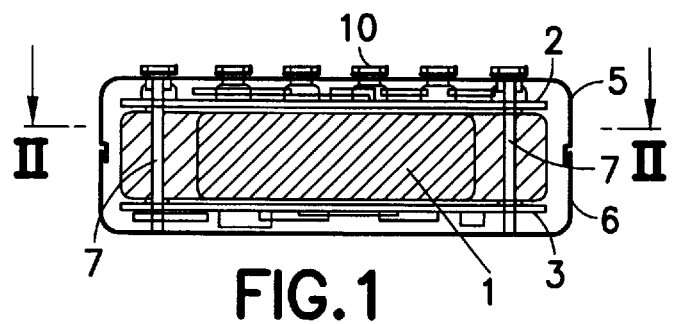
FIGS. 1–3 depict cross-sectional views of a radio telephone in accordance with the invention.
Figure 2:
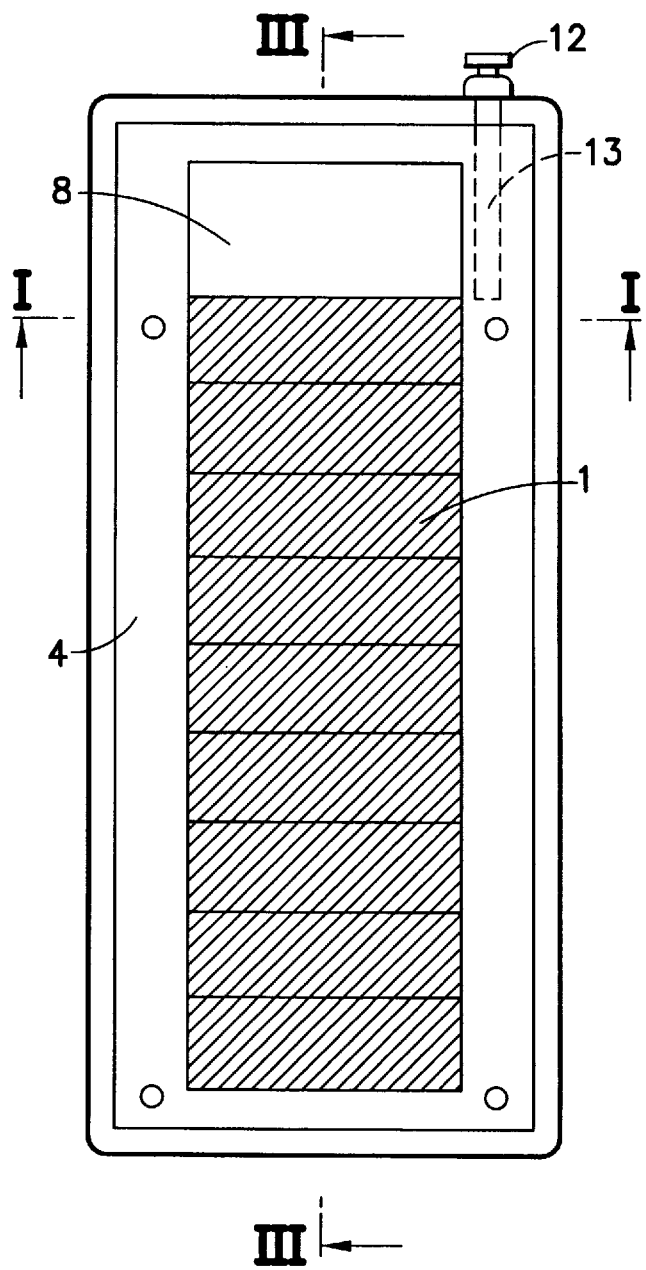
Figure 3:
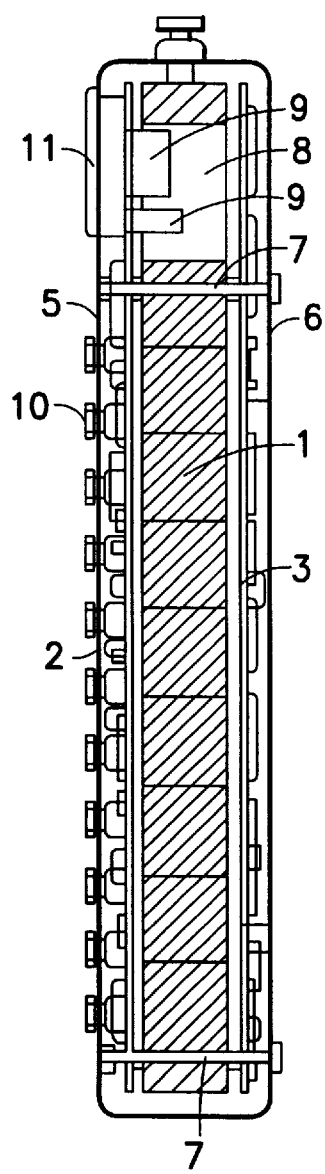

The radio telephone of FIGS. 1 to 3 comprises a housing having a front and a back housing portions 5 and 6 enclosing a rechargeable battery 1 and printed circuit boards 2, 3. The battery 1 may be formed by a plurality of cells. The cells of the battery 1 are surrounded by a support structure 4, to which the printed circuit boards 2, 3 and the housing portions 5, 6 are secured using screws 7. The support structure 4 is a frame substantially surrounding the battery elements 1, there being in its upper portion a hollow space a for large components 9. In the embodiment shown, the frame 4 has a general elongate rectangular-like shape, The battery 1 is located in the central interior area of the frame 4. As seen in the figures, the battery 1 has a general planar shape and extends along a majority of the frame. The upper printed circuit board serves as the master board. The most essential system functions, some of the RF functions, the keyboard 10, and the display 11 are provided an the master circuit board. The lower printed circuit board 3, the slave board, contains the RF functions which require shielding and the rest of the system functions, such as the power supply connection. The rapid and interference causing logic functions required by digital dual mode telephones may also be on the slave, board.

If the frame 4 is a plastic structure, the antenna 12 can be pushed into a space 13 in the frame.

In a radio telephone in accordance with the invention the battery 1 may be surrounded by a support structure to which the printed circuit boards 2, 3 and the housings are secured. In the structure of a radio telephone, the metallic or plastic support frame 4 around the battery 1 may together with the battery 1 serve as a structure which holds the entire telephone together. The battery 1 may be glued to this support 4, which is a frame surrounding the battery 1. The battery 1 can be replaced by replacing the entire support frame 4 with the battery. Centralized servicing can also replace the battery and the frame. The plastic housing parts of the telephone maybe secured to each other by screws which pass through the support frame 4, and the same screws will also keep the printed circuit boards 2, 3 in place. The battery leads connect to clamps on one of the circuit boards 2, 3.

The merits of this structural design can be deemed to include its modularity and its good protection from interference, since the battery 1 serves as very good RF screen between the printed circuit boards 2, 3. As seen in the figures, the battery is suitably sized, shaped, and located relative to the slave board 3 to function as an RF shield to shield the side of the board located adjacent the battery 1 from RF interference. It is possible to optimize the centre of gravity of a portable telephone in accordance with the precise location of the battery. The support structure will help to dissipate the generated heat evenly throughout the telephone.

In view of the foregoing it will be clear to a person skilled in the art that modifications can be made without departing from the scope of the present invention.

What is claimed is:

1. A radio telephone comprising a housing, a rechargeable battery and a substrate comprising electronic components, characterized in that the battery forms part of an elongate generally planar support structure to which the substrate and the housing are secured, wherein the battery is surrounded by and permanently fixed to a frame member forming part of the support structure, the substrate and housing being secured to and substantially entirely supported by the frame member.

2. A radio telephone as claimed in claim 1, wherein a cavity is provided between the frame and the battery.

3. A radio telephone as claimed in claim 1, wherein the battery comprises a plurality of battery cells.

4. A radio telephone as claimed in claim 1, wherein the substrate is a printed circuit board.

5. A radio telephone as claimed in claim 1, including a further substrate, wherein one substrate is provided on one side of the battery and the other substrate is provided on the opposite side of the battery.

6. A radio telephone as claimed in claim 5, wherein the components which produce radio frequency interference are disposed on the opposite side of the battery from components which require radio frequency shielding.

7. A radio telephone comprising:

a first substrate having electronic components;

a frame having the substrate connected thereto; and a battery located in a generally interior area of the frame and permanently connected to the frame, the battery being suitably sized, shaped, and located relative to the substrate to function as an RF shield to a majority of a first planar side of the substrate.

8. A radio telephone as in claim 7 wherein the frame has a general ring-like shape.

9. A radio telephone as in claim 7 further comprising a second substrate with electronic components connected to the frame to sandwich the battery between the two substrates.

\* \* \* \* \*